(12) United States Patent
Kim et al.

(10) Patent No.: US 10,436,634 B2
(45) Date of Patent: Oct. 8, 2019

(54) PHOTO DETECTING SENSOR HAVING MICRO LENS ARRAY

(71) Applicant: LG Electronics Inc., Seoul (KR)

(72) Inventors: Bo Lam Kim, Seoul (KR); Sang Keun Lee, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 558 days.

(21) Appl. No.: 14/954,334

(22) Filed: Nov. 30, 2015

(65) Prior Publication Data
US 2016/0153830 A1    Jun. 2, 2016

(30) Foreign Application Priority Data

Nov. 28, 2014  (KR) .................. 10-2014-0168386

(51) Int. Cl.
*G01J 1/44* (2006.01)
*G01J 1/04* (2006.01)
*G01J 1/42* (2006.01)
*H01L 27/146* (2006.01)

(52) U.S. Cl.
CPC .......... *G01J 1/0411* (2013.01); *G01J 1/0407* (2013.01); *G01J 1/42* (2013.01); *H01L 27/14625* (2013.01); *H01L 27/14627* (2013.01)

(58) Field of Classification Search
CPC .......... G01J 1/0407; G01J 1/0411; G01J 1/42; H01L 27/14625; H01L 27/14627
USPC .......................................... 250/206
See application file for complete search history.

(56) References Cited

U.S. PATENT DOCUMENTS

| | | | | |
|---|---|---|---|---|
| 6,188,094 B1* | 2/2001 | Kochi | ............... | H01L 27/14609 257/232 |
| 6,953,925 B2* | 10/2005 | Fang | ................. | H01L 27/14601 250/208.1 |
| 7,491,923 B2* | 2/2009 | Tani | ................. | H01L 27/14627 250/208.1 |
| 2007/0146513 A1* | 6/2007 | Kuroiwa | ........... | H01L 27/14625 348/272 |
| 2008/0030724 A1* | 2/2008 | Lee | ................... | H01L 27/14627 356/225 |
| 2010/0103527 A1* | 4/2010 | Endle | ........................ | B44F 7/00 359/620 |
| 2012/0050562 A1* | 3/2012 | Perwass | ............... | H04N 5/2254 348/222.1 |
| 2012/0050589 A1* | 3/2012 | Ueno | ..................... | H04N 9/045 348/274 |
| 2014/0285693 A1* | 9/2014 | Kobayashi | .......... | G02B 3/0062 348/294 |
| 2015/0062390 A1* | 3/2015 | Kim | ........................ | G02B 7/34 348/273 |

* cited by examiner

*Primary Examiner* — Georgia Y Epps
(74) *Attorney, Agent, or Firm* — Birch, Stewart, Kolasch & Birch, LLP

(57) ABSTRACT

The exemplary embodiment of the present disclosure relates to a photo detecting sensor including a photo detector configured to detect an optical signal incident on an active detecting area for optical detection, an optical part arranged at a front side of the photo detector to pass the optical signal, and a micro lens array interposed between the optical part and the photo detector to concentrate the optical signal having passed the optical part to within the active detecting area of the photo detector.

17 Claims, 6 Drawing Sheets

PHOTO DETECTING SENSOR HAVING MICRO LENS ARRAY

Pursuant to 35 U.S.C. § 119(a), this application claims the benefit of earlier filing date and right of priority to Korean Patent Application No.: 10-2014-0168386, filed on Nov. 28, 2014, contents of which are hereby incorporated by references in their entirety.

BACKGROUND OF THE DISCLOSURE

Field of the Disclosure

The teachings in accordance with exemplary and non-limiting embodiments of this disclosure generally relate generally to a photo detecting sensor having a micro lens array, and more particularly to a photo detecting sensor having a micro lens array configured to balance energy conversion efficiency in an active detecting area for beams adequately incident on a photo detecting sensor regardless of a central area and a non-active area, and to prevent a optical loss in the non-active area.

Discussion of the Related Art

This section provides background information related to the present disclosure which is not necessarily prior art.

A photo detecting sensor is used for a photoelectric conversion process converting an image processing or a displayed image. That is, the photo detecting sensor grasps movement or existence of a subject using a visible light or an infrared. To be more specific, an infrared, a near infrared and a visible light reflected or emitted from a subject is used by an electromagnetic radiation spectrum to discern changes in the subject. The photo detecting sensors may be regularly and repeatedly aligned to be used as an optical array device.

A unit cell of the photo detecting sensor may be comprised of an active detecting area configured to substantially detect a light incident from outside and a non-active area configured to process a signal detected by the active detecting area. An SNR (Signal to Noise Ratio) and accuracy of light detection can be increased as a received light amount grows greater in a photo detecting sensor. Although it may suffice to increase a transmission light amount (intensity) as much as an amount desired to be improved, an increase of transmission light amount may suffer from restraints due to eye safety, costs and limits on a system, in order to improve the received light amount.

Furthermore, the photo detecting sensor is limited in current resistance characteristics and allowable light energy density in each position in an active detecting area relative to incident light. Thus, the energy conversion efficiency in the photo detecting sensor is mutually different between a central area and a non-active area. For example, although a light incident on the central area has a relatively great optical power, an optical energy density may be saturated due to the light being concentrated in small-sized spots.

Meanwhile, a light incident on a non-active area may have a greater-sized spots due to being of relatively great influence in aberration over the active detecting area to disadvantageously generate an optical loss due to only a part of spots being incident on the active detecting area.

SUMMARY OF THE DISCLOSURE

This section provides a general summary of the disclosure, and is not a comprehensive disclosure of its full scope or all of its features.

Exemplary aspects of the present disclosure are to substantially solve at least the above problems and/or disadvantages and to provide at least the advantages of a camera module, and therefore, it is an object of the present disclosure to provide a photo detecting sensor having a micro lens array configured to balance energy conversion efficiency in an active detecting area for beams adequately incident on a photo detecting sensor regardless of a central area and a non-active area, and to prevent an optical loss in the non-active area.

It should be emphasized, however, that the present disclosure is not limited to a particular disclosure, as explained above. It should be understood that other technical objects not mentioned herein may be appreciated by those skilled in the art.

Accordingly, in one general aspect of the present disclosure, there is provided a photo detecting sensor, comprising:

a photo detector configured to detect an optical signal incident on an active detecting area for optical detection;

an optical part arranged at a front side of the photo detector to pass the optical signal; and a micro lens array interposed between the optical part and the photo detector to concentrate the optical signal having passed the optical part to within the active detecting area of the photo detector.

Preferably, but not necessarily, the micro lens array may include a first micro lens part having a concave lens characteristic and a second micro lens part having a convex lens characteristic, wherein the first micro lens part is arranged at an inner side of the second micro lens part.

Preferably, but not necessarily, the first micro lens part may include a plurality of concave lenses, and the second micro lens part includes a plurality of convex lenses.

Preferably, but not necessarily, each of the plurality of concave lenses may have a size different from each of the plurality of convex lenses.

Preferably, but not necessarily, each of the plurality of concave lenses may correspond to each of the plurality of convex lenses.

Preferably, but not necessarily, each of the plurality of concave lenses may have a same size.

Preferably, but not necessarily, each of the plurality of convex lenses may have a same size.

Preferably, but not necessarily, the micro lens array may be arranged by being attached to a surface of the photo detector.

Preferably, but not necessarily, the number of plurality of concave lenses and the number of plurality of convex lenses may be determined in consideration of current resistance and optical energy for each position inside the active detecting area.

Preferably, but not necessarily, the plurality of concave lenses and the plurality of convex lenses may be symmetrical based on a central point of the micro lens array.

Preferably, but not necessarily, the plurality of concave lenses and the plurality of convex lenses may be symmetrical based on an imaginary line passing a center of the micro lens array.

Preferably, but not necessarily, the micro lens array may include a substrate, and a plurality of lenses so formed at one surface or both surfaces of the substrate as to have a concave shape or a convex shape.

Preferably, but not necessarily, the micro lens array may be arranged at a central area with a micro lens having a concave lens characteristic, and may be arranged at a non-active area arranged at an outside of the central area with a micro lens having a convex lens characteristic.

Preferably, but not necessarily, the central area may be incident by optical signals gathered in small-sized spots, albeit having a great optical power over that of the non-active area.

Preferably, but not necessarily, the micro lens array may be configured in a manner such that optical signals incident on the central area are dispersed, and optical signals incident on the non-active area arranged at an outside of the central area are gathered to allow advancing to the photo detector.

ADVANTAGEOUS EFFECTS OF THE DISCLOSURE

Teachings in accordance with the exemplary embodiments of the present disclosure have an advantageous effect in that a micro lens array is installed at a front side of a photo detector of a photo detecting sensor to allow dispersing an incident light using a concave lens characteristic at an active detecting area of the micro lens array, and to allow having smaller spot sizes using a convex lens characteristic at a non-active area, whereby lights are adequately incident on the photo detector regardless of the active detecting area and the non-active area to balance an energy conversion efficiency at the active-detecting area and to effectively prevent an optical loss at the non-active area.

DETAILED DESCRIPTION

Exemplary embodiments of the present disclosure will be described in detail with reference to the accompanying drawings.

This disclosure may, however, be embodied in many different forms and should not be construed as limited to any specific structure or function presented throughout this disclosure.

Unless otherwise defined, all terms including technical and scientific terms used herein have the same meaning as commonly understood by one of ordinary skill in the art to which this invention belongs. However, there are some terminologies arbitrarily selected by the applicant in particular instances, and in this case, the meanings thereof are explained in detail in the description of the Detailed Description, and therefore, this disclosure must be interpreted as having a meaning of the terminology which is not of a simple common terminology.

It will be understood that the terms "comprises" and/or "comprising,", "includes" and/or "including" when used in this specification, specify the presence of stated features, steps, operations, elements, and/or components, but do not preclude the presence or addition of one or more other features, steps, operations, elements, components, and/or groups thereof.

Figure 1:
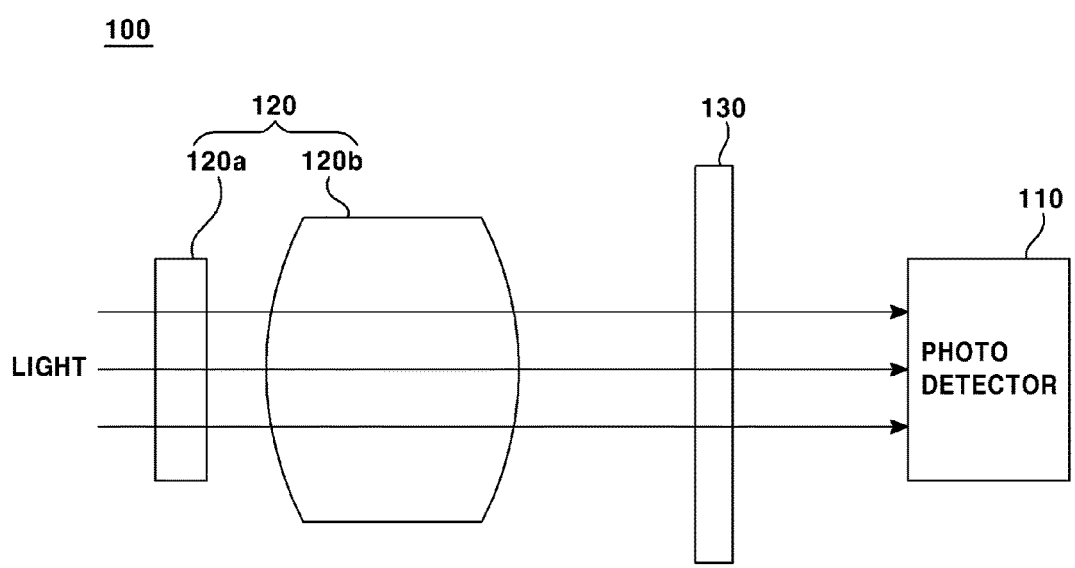
FIG. 1 is a schematic view illustrating a photo detecting sensor having a micro lens array according to an exemplary embodiment of the present disclosure.
Figure 2:
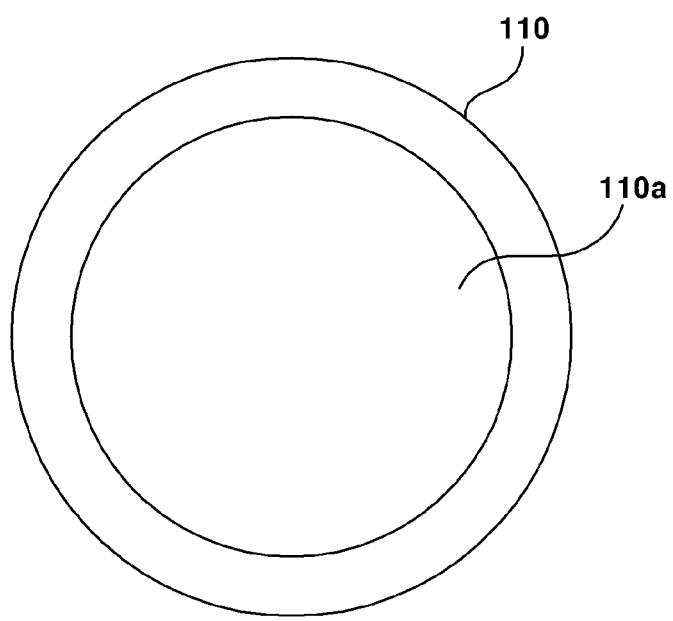
FIG. 2 is a schematic view illustrating a photo detector of a photo detecting sensor having a micro lens array according to an exemplary embodiment of the present disclosure.

FIG. 1 is a schematic view illustrating a photo detecting sensor having a micro lens array according to an exemplary embodiment of the present disclosure, and FIG. 2 is a schematic view illustrating a photo detector of a photo detecting sensor having a micro lens array according to an exemplary embodiment of the present disclosure.

Referring to FIG. 1, a photo detecting sensor (100) having a micro lens array according to an exemplary embodiment of the present disclosure may include a photo detector (110), an optical part (120), and a micro lens array (130). The photo detector (110), the optical part (120), and the micro lens array (130) may be assembled in a housing.

Referring to FIG. 2, the photo detector (110) may be so configured as to detect optical signal incident on an active detecting area (110a) for detecting a light. The photo detector (110) may detect presence/absence or colors of an object by detecting a light. The photo detector (110) may be a PD (Photo Diode), a PT (Photo Transistor), an APD (Avalanche Photodiode), a CdS sensor, a photo coupler, an image sensor, a color sensor, an ultraviolet sensor and a solar cell, for example.

The optical part (120) may be so configured as to be installed at a front side of the photo detector (110) to pass an optical signal. The optical part (120) may include a dichroic filter (120a) and a condensing lens (120b), for example. The dichroic filter (120a) may be a first optical part configured to reflect or pass a light in response to wavelength. The condensing lens (120b) may be a second optical part configured to condense the light having passed the dichroic filter (120a). The condensing lens (120b) may be comprised of one lens or a plurality of lenses, where the dichroic filter (120a) may be selectively adopted, as necessary.

The micro lens array (130) may be interposed between the photo detector (110) and the optical part (120) to condense the light having passed the optical part (120) within an active detecting area for optical detection of the photo detector (110). The micro lens array (130) may be arranged with a micro lens having a concave lens characteristic toward a central area, and with a micro lens having a convex lens characteristic toward a non-active area.

Figure 3:
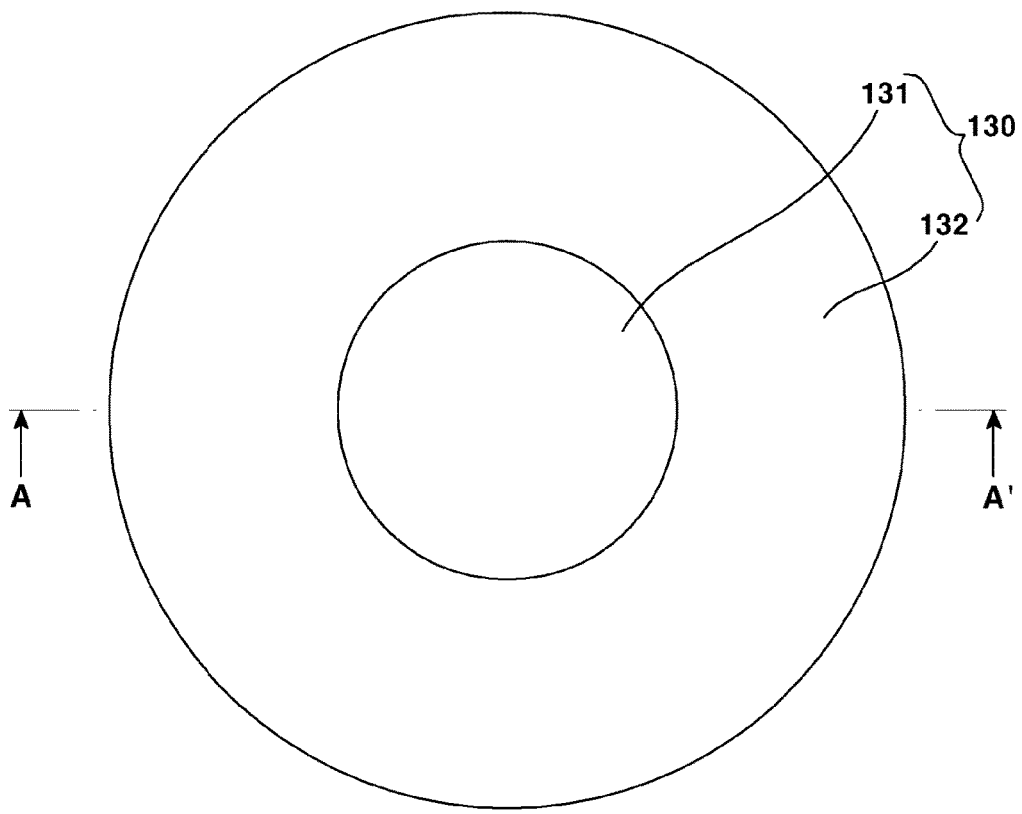
FIG. 3 is a schematic view illustrating a micro lens array according to an exemplary embodiment of the present disclosure.
Figure 4:
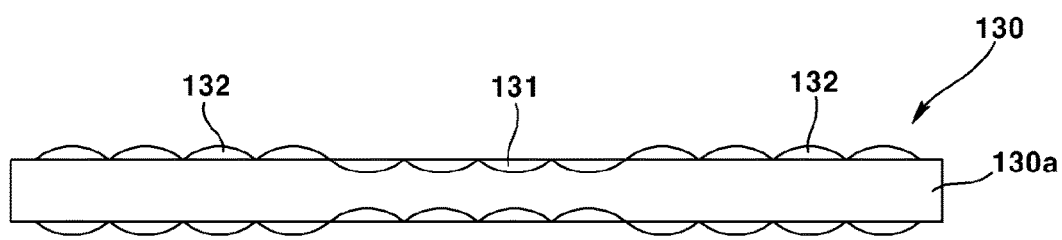
FIG. 4 is a cross-sectional view taken along line A-A' of FIG. 3.

FIG. 3 is a schematic view illustrating a micro lens array according to an exemplary embodiment of the present disclosure, and FIG. 4 is a cross-sectional view taken along line A-A' of FIG. 3.

Referring to FIGS. 3 and 4, the micro lens array (130) according to an exemplary embodiment of the present disclosure may include a substrate (130a), a plurality of first micro lens (131) having a concave lens characteristic, and a plurality of second micro lens (132) having a convex lens characteristic.

The plurality of first micro lenses (131) and the plurality of second micro lenses (132) may be symmetrically arranged from an active detecting area toward a non-active area at the outside.

The number of plurality of first micro lenses (131) and the number of plurality of second micro lenses (132) may be set in consideration of current resistance and optical energy for each position inside the active detecting area (110a) for optical detection. The micro lens array (130) may include micro lenses so formed at both surfaces of the substrate (130a) as to have a concave shape or a convex shape. Here, although the micro lens array (130) includes micro lenses so formed at both surfaces of the substrate (130a) as to have a concave shape or a convex shape, the micro lens array (130) may be so formed as to have micro lenses so formed at one surface of the substrate (130a) as to have a concave shape or a convex shape according to another exemplary embodiment of the present disclosure.

The plurality of first micro lenses (131) and the plurality of second micro lenses (132) in the micro lens array (130) according to an exemplary embodiment of the present disclosure may have a different size. The plurality of first micro lenses (131) and the plurality of second micro lenses (132) in the micro lens array (130) according to another exemplary embodiment of the present disclosure may have a different size.

The substrate (130a) may pass a light incident from outside. The substrate (130a) may have a predetermined thin thickness of 100 μm~350 μm, for example, such that the substrate (130a) can be easily flexed like a film and easily wound on a roll. The first micro lenses (131) and the second micro lenses (132) may be so formed on both sides of the substrate (130a) as to have an embossed hemisphere or an engraved hemisphere. That is, the first micro lenses (131) and the second micro lenses (132) may be so formed on both sides of the substrate (130a) as to have a protrusively embossed hemisphere or a concavely engraved hemisphere.

At this time, the first micro lenses (131) and the second micro lenses (132) may be formed on both sides of the substrate (130a) through a roll-to-roll method due to thin thickness of the substrate (130a). At this time, the first micro lenses (131) and the second micro lenses (132) may be formed on both sides of the substrate (130a), the present disclosure is not limited thereto.

As discussed in the foregoing, when the first micro lenses (131) and the second micro lenses (132) are so formed on both sides of the substrate (130a) as to have an embossed hemisphere or an engraved hemisphere, a light incident from outside by the concave lens characteristic is refracted and dispersed to have spots of greater size at the central area formed with the first micro lenses (131).

Meantime, a light incident from outside by the convex lens characteristic is refracted to have spots of smaller size at the non-active area formed with the second micro lenses (132). Because of these characteristics, the light incident from outside can be evenly dispersed and condensed.

At this time, the micro lens array (130) may be so formed with polymer resin as to pass a light incident from outside. At this time, the polymer resin may be selected from a group consisting of acrylic, polycarbonate, polypropylene, polyethylene and polyethylene terephthalate.

Figure 5:
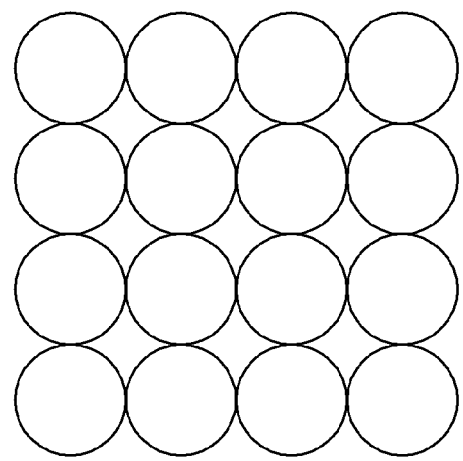
FIGS. 5, 6 and 7 are plan views illustrating various variations to shapes of micro lenses in a micro lens array according to an exemplary embodiment of the present disclosure.
Figure 6:
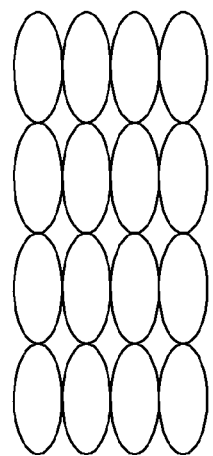
Figure 7:
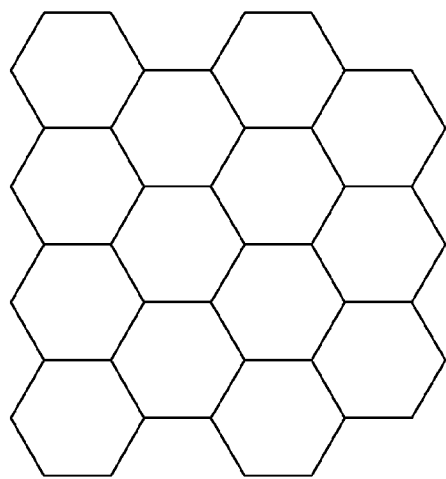

FIGS. 5, 6 and 7 are plan views illustrating various variations to shapes of micro lenses in a micro lens array according to an exemplary embodiment of the present disclosure.

Referring to FIGS. 5, 6 and 7, although the first micro lenses (131) and the second micro lenses (132) may be so formed on both sides of the substrate (130a) as to have an embossed hemisphere or an engraved hemisphere, in order to satisfy the configuration, shapes of bottom surfaces of the first micro lenses (131) and the second micro lenses (132) may be variably formed. At this time, the bottom surfaces of the first micro lenses (131) and the second micro lenses (132) refer to surfaces of the first micro lenses (131) and the second micro lenses (132) that contact the substrate (130a).

For example, shapes of bottom surfaces of the first micro lenses (131) and the second micro lenses (132) may be round as shown in FIG. 5. In this case, the first micro lenses (131) and the second micro lenses (132) may be protrusively or concavely formed from the bottom surfaces of the round shapes in a hemispherical manner. Furthermore, the first micro lenses (131) and the second micro lenses (132) may be protrusively or concavely formed from the bottom surfaces of oval shapes in a hemispherical manner.

Furthermore, the shapes of bottom surfaces of the first micro lenses (131) and the second micro lenses (132) may be of a polygon, or a regular hexagon, for example, as illustrated in FIG. 7. In this case, the first micro lenses (131) and the second micro lenses (132) may be protrusively or concavely formed from the bottom surfaces in a hemispherical manner.

A total area on a plan view occupied by the first micro lenses (131) and the second micro lenses (132), that is, a total area of bottom surfaces of the first micro lenses (131) and the second micro lenses (132) may be made to occupy 70%~100% of one surface of the substrate (130a), by adequately selecting bottom surfaces of the first micro lenses (131) and the second micro lenses (132) and a distance between micro lenses (220).

Figure 8:
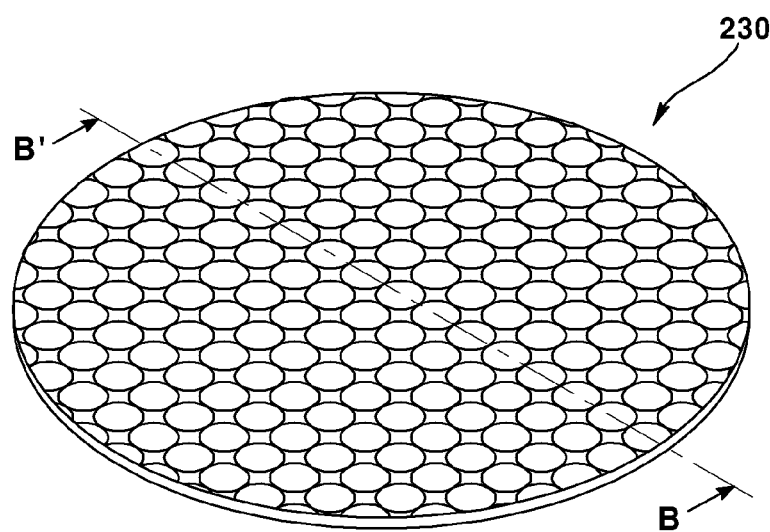
FIG. 8 is a schematic view illustrating a micro lens array according to another exemplary embodiment of the present disclosure.
Figure 9:
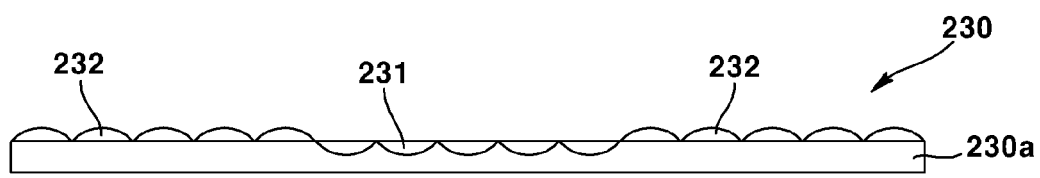
FIG. 9 is a cross-sectional view taken along line B-B' of FIG. 8.

FIG. 8 is a schematic view illustrating a micro lens array according to another exemplary embodiment of the present disclosure, and FIG. 9 is a cross-sectional view taken along line B-B' of FIG. 8.

Referring to FIGS. 8 and 9, a micro lens array (230) according to another exemplary embodiment of the present disclosure may be installed by being attached to a surface of a photo detector. For example, the micro lens array (230) may be attached to a surface of the photo detector in a sheet type.

The micro lens array (230) may include a first micro lens (231) and a second micro lens (232). The first micro lens (231) and the second micro lens (232) may be so formed on one side of a substrate (230a) as to have an embossed hemisphere or an engraved hemisphere. That is, the first micro lens (231) and the second micro lens (232) may be so formed on one side of a substrate (230a) as to have an embossed hemisphere or an engraved hemisphere like a lenticular lens.

The above-mentioned photo detecting sensor according to the exemplary embodiments of the present disclosure may, however, be embodied in many different forms and should not be construed as limited to the embodiments set forth herein. Thus, it is intended that embodiments of the present disclosure may cover the modifications and variations of this disclosure provided they come within the scope of the appended claims and their equivalents. While particular features or aspects may have been disclosed with respect to several embodiments, such features or aspects may be selectively combined with one or more other features and/or aspects of other embodiments as may be desired.

What is claimed is:

1. A photo detecting sensor, comprising:
   a photo detector detecting an optical signal incident on an active detecting area;
   an optical part disposed at a front side of the photo detector, and passing the optical signal; and
   a micro lens array disposed between the optical part and the photo detector, and concentrating the optical signal passing through the optical part to the active detecting area of the photo detector,
   wherein the micro lens array includes a plurality of first micro lenses having a concave lens characteristic and a plurality of second micro lenses having a convex lens characteristic, and the first micro lenses and the second micro lenses are formed through a roll-to-roll method,
wherein the first micro lenses and the second micro lenses are formed to have an embossed hemisphere or an engraved hemisphere, and
wherein the micro lens array is arranged with the plurality of first micro lenses having the concave lens characteristic toward a central area of the micro lens array, and with the plurality of second micro lenses having the convex lens characteristic toward a non-active area of the micro lens array.

2. The photo detecting sensor of claim 1, wherein the plurality of first micro lenses are arranged at an inner side of the plurality of second micro lenses.

3. The photo detecting sensor of claim 2, wherein the plurality of first micro lens part includes a plurality of concave lenses, and the plurality of second micro lenses include a plurality of convex lenses.

4. The photo detecting sensor of claim 3, wherein each of the plurality of concave lenses has a size different from each of the plurality of convex lenses.

5. The photo detecting sensor of claim 3, wherein each of the plurality of concave lenses corresponds to each of the plurality of convex lenses.

6. The photo detecting sensor of claim 1, wherein each of the plurality of first micro lenses has a same size.

7. The photo detecting sensor of claim 1, wherein each of the plurality of second micro lenses has a same size.

8. The photo detecting sensor of claim 1, wherein the micro lens array is arranged by being attached to a surface of the photo detector.

9. The photo detecting sensor of claim 3, wherein the number of plurality of concave lenses and the number of plurality of convex lenses are determined in consideration of current resistance and optical energy for each position inside the active detecting area.

10. The photo detecting sensor of claim 3, wherein the plurality of concave lenses and the plurality of convex lenses are symmetrical based on a central point of the micro lens array.

11. The photo detecting sensor of claim 3, wherein the plurality of concave lenses and the plurality of convex lenses are symmetrical based on an imaginary line passing a center of the micro lens array.

12. The photo detecting sensor of claim 1, wherein the micro lens array includes a substrate and a plurality of lenses so formed at one surface or both surfaces of the substrate to have a concave shape or a convex shape.

13. The photo detecting sensor of claim 1, wherein the non-active area is arranged at an outside of the central area.

14. The photo detecting sensor of claim 13, wherein the central area is incident by optical signals gathered in small-sized spots, albeit having a great optical power over that of the non-active area.

15. The photo detecting sensor of claim 1, wherein the micro lens array is configured in a manner such that optical signals incident on a central area are dispersed, and optical signals incident on the non-active area arranged at an outside of the central area are gathered to allow advancing to the photo detector.

16. The photo detecting sensor of claim 1, wherein shapes of bottom surfaces of the first micro lenses and the second micro lenses are regular hexagon.

17. The photo detecting sensor of claim 1, wherein a first light incident from outside is refracted and dispersed by the plurality of first micro lenses to have spots of greater size at the central area formed with the plurality of first micro lenses and a second light incident from outside by the plurality of second micro lenses is refracted to have spots of smaller size at the non-active area formed with the plurality of second micro lenses.

\* \* \* \* \*